United States Patent [19]

Brooks et al.

[11] Patent Number: 4,620,167
[45] Date of Patent: Oct. 28, 1986

[54] SURFACE ACOUSTIC WAVE SYSTEMS AND METHODS

[75] Inventors: Robert E. Brooks, Manhattan Beach; David Penunuri, Placentia, both of Calif.

[73] Assignee: TRW Inc., Ohio

[21] Appl. No.: 732,117

[22] Filed: May 9, 1985

[51] Int. Cl.$^4$ .................. H03H 9/12; H03H 9/145; H04N 5/30
[52] U.S. Cl. .................. 333/195; 310/313 D; 333/153; 358/201; 358/213; 357/26; 357/30
[58] Field of Search .................. 333/150–155, 333/193–196; 364/821, 822; 310/313 R, 313 A, 313 B, 313 C, 313 D; 358/200, 201, 213; 357/26, 29, 30; 324/77 B, 77 C, 77 CS, 77 K, 77 H, 78 R, 78 F, 80, 82

[56] References Cited

U.S. PATENT DOCUMENTS

| | | | |
|---|---|---|---|
| 3,893,047 | 7/1975 | Lardat | 333/153 |
| 4,012,586 | 3/1977 | Roos | 310/313 B X |
| 4,084,189 | 4/1978 | Lean | 310/313 B |
| 4,142,212 | 2/1979 | Scott et al. | 358/201 X |

FOREIGN PATENT DOCUMENTS 0813302 3/1981 U.S.S.R. .................. 324/77 B

Primary Examiner—Marvin L. Nussbaum
Attorney, Agent, or Firm—Raymond A. Bogucki; Noel F. Heal

[57] ABSTRACT

Dynamic variation of the functional properties of a surface acoustic wave (SAW) device is achieved by using photoconductive material on a wave propagating substrate and illuminating the material with changing light patterns. Photoconductive materials, such as lead sulfide or cadmium sulfide, are used that are essentially dielectrics and have substantially no effect on SAW propagation when not illuminated, but under suitable levels of illumination become resistive and interact with the electric fields of the waves to dissipate energy as heat. Scanning control of the areas of illumination may be used to attenuate sidelobes and scattering in a wideband system, while intensity variations may be used to amplitude modulate the waves.

11 Claims, 3 Drawing Figures

SURFACE ACOUSTIC WAVE SYSTEMS AND METHODS

BACKGROUND OF THE INVENTION

A number of intricate and complex signal processing functions, such as the generation of Fourier transforms, are now being effected by surface acoustic wave (SAW) systems. In one example of a SAW system a transmitting means (typically one or an array of small input transducers) excites surface waves on a wave propagating substrate. The waves interact to provide spatially or temporally modified wave variations that are reproduced in receiving transducers. For example, an array of input transducers may be configured so that, in response to a wideband signal input, they generate diffraction patterns forming beams at one or more different angles dependent upon the frequencies present in the input band. Output transducers at specific locations in the beam paths can then detect the signals, so that the system functions as a unique form of spectrum analyzer. Using modern photolithographic techniques and certain available materials, small but wideband devices can be constructed that are readily reproducible and have the further advantage of preserving phase coherence.

Sidelobes, scattering, and other spurious transmissions inevitably are present in transmitted waves to some degree. Because of the spatial operative characteristics of SAW devices, they may distribute such unwanted wave energy in known locations on the substrate, at different points in time. Where the conditions are invariant, the waves may be dissipated by an attenuating or absorbing layer, such as a rubbery compound. This technique is not applicable, however, when conditions vary, as is almost inherently the case with a wideband system. For example, it may be desirable to track a signal of varying frequency, while excising signals of other frequencies, so as to provide dynamic filtering. Whether used for such elemental functions as signal modulation, or for system purposes such as improvement of characteristics, such capabilities would offer new dimensions for signal control and processing functions.

It is well known in advanced signal processing techniques to use surface acoustic waves to modulate light in transforming signals. A related but different technique is to utilize a special configuration of SAW substrate, in conjunction with photoconductive layers, to convert an optical image to electrical signals. Such systems are discussed in articles entitled "Two-dimensional Photoacoustic Image Processing With Longitudinal Waves" by S. T. Kowel et al, in the 1978 *Ultrasonics Symposium Proceedings*, pp. 258-262 and "DEFT Sensor Operating At 100 MHz" by S. T. Kowel et al, in the 1979 *Ultrasonics Symposium Proceedings*, pp. 85-89. These articles describe how surface acoustic waves enable scanning of a semiconductor light sensor positioned on the SAW substrate surface, and the manner in which Fourier spectra may be obtained. A system in which optical energy is utilized to modify the characteristics of a SAW device itself is described in issued U.S. Pat. No. 3,911,381, to Robert E. Brooks et al, entitled "Tunable Acoustic Wave Propagation Device", Oct. 7, 1975. In this sytem, a photoconductive overlay on a SAW substrate is used in a system in which a coupler is disposed between transmitting and receiving elements. In this arrangement, the properties of the multi-strip coupler are modified by a static pattern presented by a photomask, a hologram, or the interference pattern between a pair of adjustable impinging coherent wavefronts. Thus the strips in the coupler are not defined by deposited conductive metallic or other elements, but by the higher conductivity regions of the photoconductive layer, under the illuminating light pattern. While this system is advantageous for the intended use, it does not otherwise serve to extend the capability of surface acoustic wave systems.

SUMMARY OF THE INVENTION

Systems in accordance with the invention modify or control propagated waves in SAW-based devices by establishing wave propagating surface areas wherein the propagation characteristics are responsive to dynamically directed electromagnetic wave energy, typically light. By selectively varying light energy impinging on thin light responsive surface layers, spatial wave patterns are controllably modified for selective signal processing purposes.

In a typical elemental structure in accordance with the invention, the wave propagating region of a substrate is covered by a thin layer of normally insulative photoconductive material whose resistance decreases markedly because of the excitation of carriers in the light-influenced region. Surface acoustic waves propagated through the substrate under the overlying layer are unaffected until encountering a local region in which carriers have been increased. In this region, the electric field moving with the traveling wave interacts with the carriers, the interaction absorbing the energy of the surface wave and converting it to thermal energy, so that the propagating acoustic wave energy is locally dissipated to a substantial or full extent. The extent of signal attenuation is controlled both by the transit distance along the illuminated area, in wavelengths at the particular frequency, and by the sheet resistivity of the material. Dynamic control of the illumination of the photoconductive layer, independently or in accordance with the signals being received, enables system functions to be effected in a unique fashion.

In a more specific example of an elemental structure in accordance with the invention, a layer of photoconductive material, such as lead sulfide, approximately 1 micron or less thick, is deposited on a SAW substrate. Sufficient light energy, of the order of 100 microwatts/$mm^2$ is directed on the photoconductive layer using a scanning or imaging method to lower the sheet resistance to approximately 50 ohm/square, thereby providing approximately 1 dB of loss for each acoustic wavelength of travel. Because SAW devices do not demand high power, and because of the areal dissipation of heat, effective control is provided by maintaining illumination for a sufficiently long wave passage interval. Where the function involved relates to wave attenuation, the results can be achieved by illuminating a sufficiently long length of propagation path. Where modulation is to be provided at extremely high frequencies, the light excitation may also be caused to track the waves transmitted through the substrate.

Frequency dependent beam diffraction SAW systems in accordance with the invention, as one specific example, incorporate a phased array of transmitting elements at one region on a wave propagating substrate, and a wideband receiving transducer positioned to be responsive to spatially dispersed, focused, and frequency dependent beams generated by the transmitting array. A strip in the form of a thin layer of photoconductive material is transversely disposed across the beam propagation path before the receiving elements, and illuminated in a pattern that is dynamically responsive to signals that are being received. Individually controllable light sources in the array illuminate spots on the thin layer on opposite sides of the nominal focus for a principal beam from the transmitting array, to attenuate sidelobes and spurious signals. As the signal being tracked varies in frequency the beam position shifts along the receiver, but the control system, being responsive to the output frequency, concurrently shifts the adjacent light spots at a comparable rate, thereby enabling more accurate tracking of the signal and increasing the signal-to-noise ratio. With practical systems, the width of the beam approaching the receiving transducer may be of the order of 100 microns in cross section, so that the adjacent light spots that create dynamic attenuation zones may be of the same order of magnitude, or less.

BRIEF DESCRIPTION OF THE DRAWINGS

A better understanding of the invention may be had by reference to the following description, taken in conjunction with the accompanying drawings, in which.

DETAILED DESCRIPTION OF THE INVENTION

Figure 1:
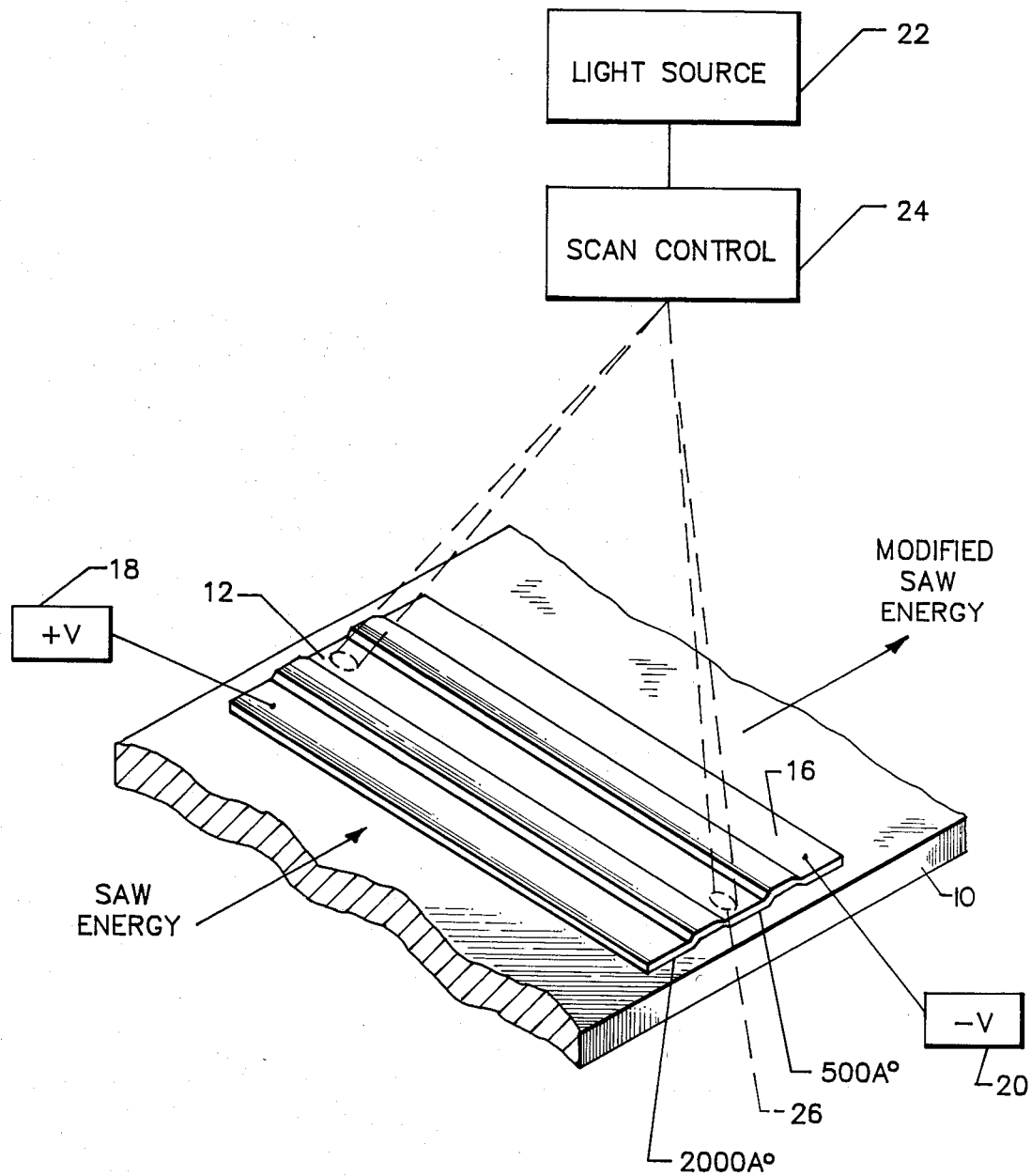
FIG. 1 is a perspective view, partially broken away, of an elemental dynamic control device for a surface acoustic wave system in accordance with the invention.

The arrangement and operative characteristics of a dynamic SAW device in accordance with the invention may be first understood by reference to the somewhat simplified depiction in FIG. 1 of an elemental structure in accordance with the invention that may be used with appropriate modifications in a wide variety of contexts, as described hereafter. In this generic substructure, surface acoustic waves are transmitted along a substrate 10 of suitable material, such as lithium niobate. Lithium niobate is a piezoelectric material, so that transducers (not shown) for exciting the surface acoustic waves may be mounted directly on the substrate 10. Receiving transducers (not shown) are mounted at a further region along the propagation path on the substrate 10. Alternatively, waves can be launched in a piezoelectric substrate and transferred to a contiguous wave propagating material that is not of piezoelectric character. However, in this device a photoconductive film layer 12 over the wave propagation path must be associated with a piezoelectric portion of the wave propagating medium to create an electric field in conjunction with the acoustic waves.

The thin layer of photosensitive material 12 is shaped to form an elongated strip that is disposed transversely to the direction of propagation of the SAW energy. This photoresponsive layer 12, here lead sulfide, is of the class of photoresponsive or photoconductive materials including cadmium sulfide (CdS) and cadmium zinc sulfide. The material may be responsive to electromagnetic wave energy in any suitable part of the frequency spectrum. However, most materials have been developed for the visible, near infrared and infrared bands, and suitable radiation sources are available as well, so that the present example employs a material sensitive in the visible to near infrared region. In this example the film is of approximately 500 Angström thickness and 1 mm in width, with a length, transverse to the wave direction, that is dependent on the configuration of the associated transducers. However, because of the small size of current day SAW array devices, this transverse length will typically be less than 10 mm. Here a length of approximately 8 mm is assumed. Each longitudinal edge of the thin photoresponsive layer 12 is overlain by a different thin gold electrode 14, 16 respectively, here each of about 1.5 mm width with approximately 0.2 mm overlap, and of approximately 2000 Angström thickness. The electrodes 14, 16 are coupled to a + voltage source 18 and a − voltage source 20, respectively impressing a low electrical potential across the thin photoresponsive layer 12. A light source 22, such as a laser, a high intensity light emitter with an array of optical fibers, a plurality of light emitting diodes (LEDs) or a focused CRT light pattern is spaced apart from the photoresponsive layer 12, and directs light of suitable intensity onto the layer 12 under what is generically termed a scan control 24. If the light source 22 is a single laser, the scan control 24 may be an acousto-optic deflector, with or without a beam splitter to provide one or more illuminating spots on the layer 12. If the light source comprises optical fibers, then the scan control 24 may be a light switching arrangement, such as a Pockels cell or other on-off of continuously variable switching system. If, on the other hand, the light source comprises light emitting diodes, then the scan control 24 may comprise a circuit for energizing the LEDs in preselected instantaneous patterns. For an imaged CRT the scan control 24 generates the proper CRT image. Depending upon the system application, the scan control 24 need not be related to variations in the signal at the surface acoustic wave transmitter.

Under "dark conditions, with no illuminating light spots, the entire surface of the thin layer 12 appears essentially as a dielectric, of substantially infinite resistivity. Surface acoustic waves propagating along the substrate 10 are unimpeded by the presence of the conductive layers 14, 16 and the intervening photoresponsive layer 12. When a small light spot, e.g. 26, is illuminated on the layer 12, however, that region of the layer has carriers excited within it, greatly lowering its sheet resistance value. The electric field moving concomitantly with the surface waves interacts with the carriers in the excited region of the layer 12. As a result the ohmic resistance of layer 12 converts the electrical energy of the wave to heat which is dissipated in the layer 12. The amount of conversion and dissipation depends upon the frequency, the area of interaction, and the resistivity of layer 12 in the illuminated area.

When the layer 12 is formed by RF sputtering, so as to minimize unwanted impurities, the sheet resistance of the layer 12 in the "dark" condition is of the order of $0.5 \times 10^6$ ohms/square. With a local light density of approximately 100 microwatts/mm$^2$, the sheet resistance is reduced by approximately four or five orders of magnitude, and the layer 12 has a bulk resistivity in the range of 0.1–50 ohm-cm in the illuminated region. Consequently, there is an attenuation in the material that is approximately 0.5–0.7 dB/$\lambda$ for the SAW frequency, using a focused light beam. With a beam diameter of approximately 100 microns, an adequate number of wavelengths exist in the typical SAW at a frequency of 500 MHz to 1 GHz to attenuate the signal by an order of magnitude. Because the lateral position of the SAW energy on the substrate 10 will be related in many SAW devices to the frequency, it may be desirable to taper the dimension of the illuminated strip 12 along the propagation direction so as to achieve an essentially uniform level of attenuation. Alternatively, the length of the illuminated spot along the propagation direction can be varied for the same purpose.

The potential existing between the electrodes 14 and 16 creates a drift field across the width of the layer 12. A high local carrier density created by the presence of the illuminated spot 26 does not instantaneously decay when the illumination stops or shifts. The drift field is therefore used to quickly sweep the carriers from the layer 12 upon termination of illumination. Sweeping the carriers in the direction of movement of the SAW energy, so as to provide a movement somewhat of the carriers synchronized with the moving SAW waves, provides a degree of increase in the time of response of the system.

The wave attenuation effect may be enhanced for a given substrate by using a thicker photoresponsive layer, up to perhaps 1 micron. Heat generated in the layer, which is of the order of only 10–100 microwatts per $mm^2$ in this example, is readily dissipated under the dynamic conditions of operation, and is aided by very rapid conduction of heat into the substrate.

Another expedient that may be employed to form the layer 12 is to provide localized areas of photoresponsive material in the wave propagating substrate itself. A gallium arsenide substrate, for example, may be locally doped in a transverse strip region with known chemical elements that impart photoresponsiveness in desired fashion. Such a material may be used for the entire substrate and is therefore both a wave propagation and a variable conductivity medium.

Figure 2:
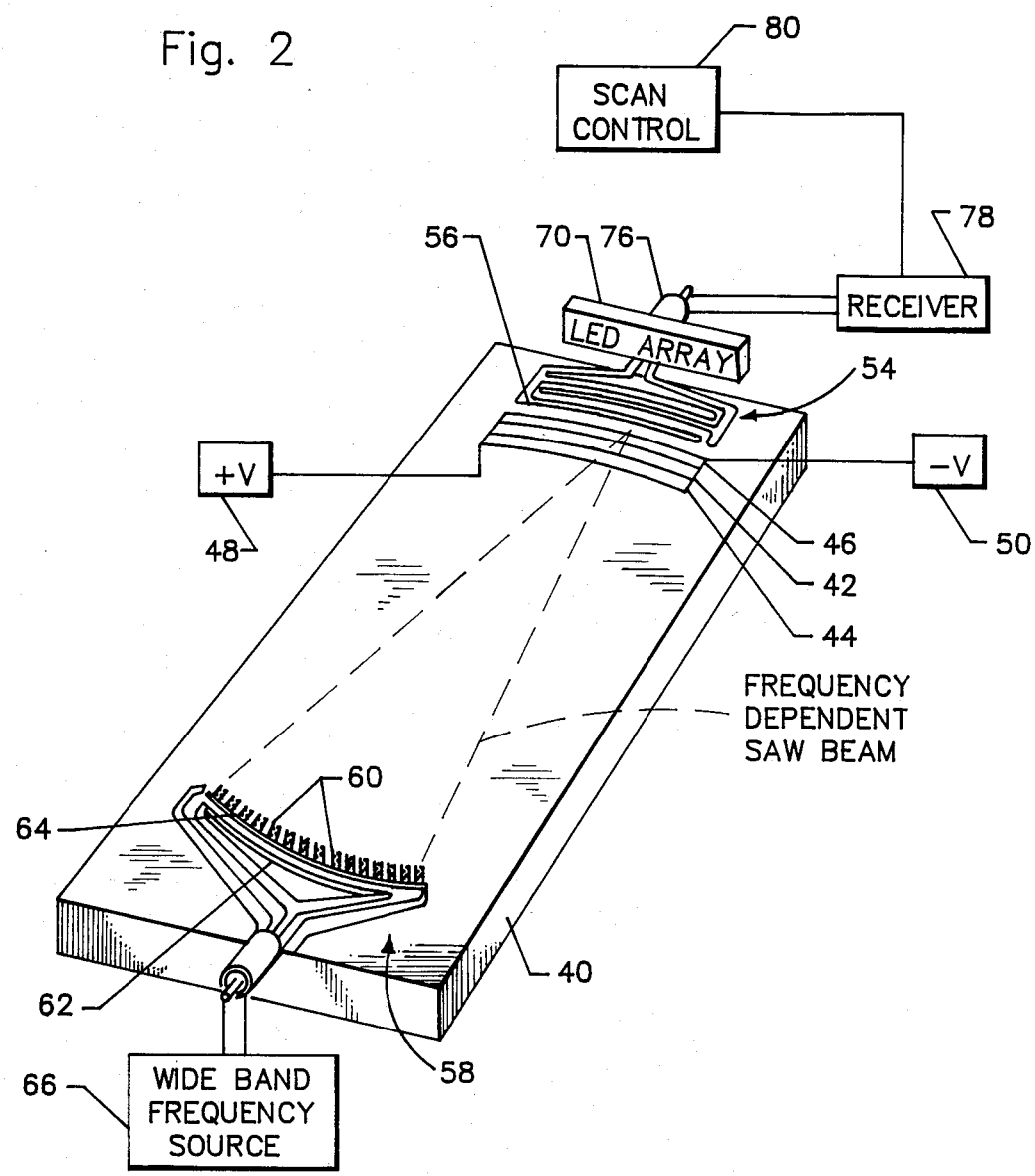
FIG. 2 is a perspective view, partially broken away, of an example of a dynamic filter system in accordance with the invention.
Figure 3:
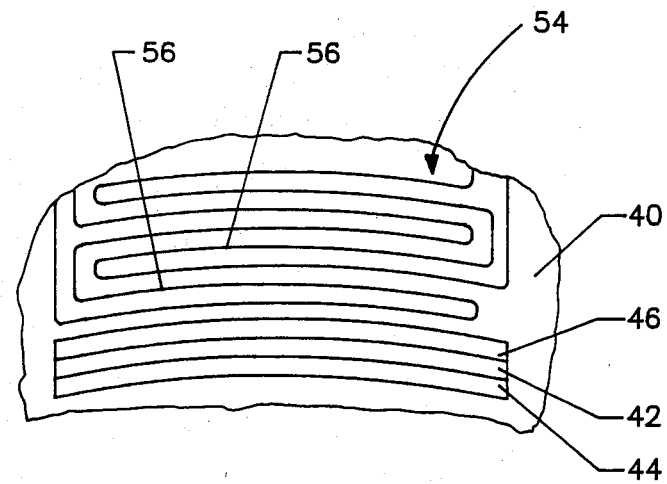
FIG. 3 is an enlarged plan view of a portion of the system of FIG. 2 showing further details of the arrangement.

A specific example of a system in accordance with the invention is provided by the dynamic filter or signal tracking system of FIGS. 2 and 3, to which reference is now made. This system incorporates a wave supporting substrate 40 of piezoelectric material, a thin, narrow layer of photoresponsive material 42 extending transverse to the wave propagation direction, and associated edge electrodes 44, 46 coupled to positive and negative voltage sources 48, 50, as previously described. The photoresponsive strip 42 is curved to correspond generally to an associated single receiving transducer 54 having interdigitated fingers 56 of varying width and spacing so as to be tuned to incoming waves of different frequencies at different positions along the transverse direction. A phased array transmitter 58 comprises a plurality of transducers 60 to which bus bars 62, 64 apply signals in parallel relation from a wideband frequency source 66 whose principal frequency component is to be tracked. The transducers are arranged in stepped phase relation to the substrate 40, so that the diffraction pattern formed by the waves excited in the substrate provides, when substantial signal energy is present at a given frequency, a beam at a selected angle. The beam is focused at the receiving transducer 54 at a position along the substrate 40 just in front of the receiving transducer 54. The point of focus is between the photoresponsive strip 42 and transducer 54. The beam is of 200–300 micron width when it passes under the photoresponsive strip 42.

An array of light emitting diodes 70 is disposed over the surface of the strip 42, with each diode configured to illuminate an elongated precisely positioned area on the strip 42. These areas 72 are approximately 500 microns long and 150 microns wide, and spaced by approximately the same distance. Thus, as shown in FIG. 3, the focused SAW beam passes between two illuminated areas on the strip 42 that block the passage of all other SAW energy toward the receiving transducer 54. The focused beam propagates with little attenuation while sidelobes and scattered energy are dissipated in the form of heat.

At the receiving transducer 54, leads extend to a connector 76 which is coupled to a signal receiver 78, including preamplifier circuits for providing an output signal representing the signal being tracked. This output signal, at varying frequency, is used to operate the scan control 84 for the LED array, illuminating, at a rapidly changing rate if necessary, the areas adjacent the edges of the scanning beam as it shifts transversely on the substrate with changes in signals at the source 66.

The system therefore uses a unique interaction between optical energy and spatially distributed SAW energy to attenuate signals outside what may be a constantly changing frequency band, thereby providing a unique type of dynamic filter, Alternatively, it can be seen that a completely different application for the optical/surface wave interaction exists in a fixed beam type of system, in which a beam of constant intensity can be amplitude modulated by transit through a light responsive overlayer which is subjected to the modulating signals.

Although there have been described above and illustrated in the drawings various forms and modifications in accordance with the invention, it will be appreciated that the invention is not limited thereto but encompasses all modifications and alternatives falling within the scope of the appended claims.

What is claimed is:

1. The method of controlling a surface acoustic wave field comprising the steps of:
   propagating a surface acoustic wave along a wave propagating surface, the wave propagating surface including an interaction region disposed along the propagation direction of the surface acoustic wave, in which interaction region wave responsive electric fields exist along with electrical carriers;
   increasing the density of the carriers in a selected spatial pattern in the interaction region by illumination with electromagnetic wave energy to produce an interaction between the electric field and the carriers such that wave energy from the acoustic wave is substantially dissipated in selected regions;
   varying the selected spatial pattern dynamically during propagation of the surface acoustic wave, wherein the surface acoustic wave varies in direction along the surface and the spatial pattern is varied in accordance with the direction of the surface acoustic wave; and
   placing a voltage across the interaction region to more quickly draw off carriers from the interaction region upon termination of illumination at a selected portion of the interaction region.

2. The method as set forth in claim 1 above, wherein the electromagnetic wave energy comprises radiation in the visible to near infrared regions and the illumination provides local interaction regions having bulk dark resistivity in the range of 0.1–1000 ohm-cm.

3. The method as set forth in claim 2 above, wherein the illumination intensity is in the range of 10–100 microwatts/mm², the sheet resistance of the interaction region is locally lowered to 1.0 ohm/square or less, and the acoustic wave energy is dissipated as heat.

4. A surface acoustic wave propagating system comprising:
means for propagating surface acoustic waves substantially along a propagation axis, including means along at least a portion thereof for providing a radiant energy responsive interaction region in which free carriers are generated; and
means for illuminating the interaction region with dynamically varying radiant energy patterns to provide selective local interactions between between the surface acoustic waves and the free carriers, to modify the surface acoustic waves;
wherein the means for propagating provides surface acoustic waves in varying directions relative to the propagation axis, and wherein the interaction region extends transversely relative to the propagation axis.

5. The invention as set forth in claim 4 above, wherein the means for illuminating the interaction region illuminates local areas in accordance with changes in direction of the propagation direction of the surface acoustic waves.

6. The invention as set forth in claim 5 above, wherein the means for propagating comprises means responsive to a wideband signal for providing a main beam at a frequency dependent direction and wherein the means for illuminating local areas illuminates areas on opposite sides of the main beam to reduce sidelobes and scattered energy.

7. A surface acoustic wave device comprising:
a piezoelectric surface acoustic wave propagating substrate.
means including a plurality of input transducers disposed in a phased array on the substrate and responsive to an input source for generating diffraction pattern beams at frequency dependent angles along the substrate;
a single output transducer on the substrate positioned to be excited by the beams;
photoresponsive means coupled to the substrate in the path of the waves before the output transducer; and
scanning means for variably illuminating the photoresponsive means to dynamically change the resistivity in localized areas thereof and attenuate surface acoustic energy therein.

8. A surface acoustic wave device comprising:
a surface acoustic wave propagating substrate having a wave transmitting region, a wave receiving region spaced from the wave transmitting region in a wave propagation direction, a narrow interaction region extending transversely to the propagation direction closer to the receiving region than the transmitting region, and a narrow focal region extending transversely to the propagation direction between the interaction region and the receiving region, the substrate having a piezoelectric characteristic in at least the interaction region causing generation of an electric field in response to propagation of a surface acoustic wave through the interaction region;
a phased array of surface acoustic wave transmitting transducers disposed on the substrate in the transmitting region and arranged to transmit surface acoustic waves toward the receiving region with a point of focus in the focal region, the position of the point of focus along the transverse extent of the focal region varying with the frequency of a transmitted surface acoustic wave;
at least one surface acoustic wave receiving transducer disposed on the substrate in the receiving region to receive transmitted acoustic waves and generate an output signal representative thereof;
photoresponsive means disposed at the interaction region coterminously therewith, the photoresponsive means generating an increased density of free electrical carriers in local areas thereof which receive incident radiant energy, the carriers interacting with an electric field generated by a surface acoustic wave propagating through the interaction region; and
a source of radiant energy disposed to illuminate at least one selected local area of the photoresponsive means.

9. The invention as set forth in claim 8 above, wherein the photoresponsive means comprises a layer of photoresponsive material and wherein the system further comprises means for controlling the source of radiant energy to scan the photoresponsive layer in accordance with the direction of transmittal of the surface acoustic waves.

10. The invention as set forth in claim 9 above, wherein the at least one local area includes all of the photoresponsive layer except an area through which surface acoustic waves in a selected frequency band are propagated.

11. The invention as set forth in claim 10 above, wherein the generated free carriers create an ohmic resistance in the photoresponsive layer to interact with an electric field generated by a surface acoustic wave propagating through the interaction region by changing energy in the electric field to heat.

* * * * *